US008786369B2

(12) United States Patent
Takagi

(10) Patent No.: US 8,786,369 B2
(45) Date of Patent: Jul. 22, 2014

(54) HIGH FREQUENCY AMPLIFIER

(75) Inventor: Kazutaka Takagi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 57 days.

(21) Appl. No.: 13/557,609

(22) Filed: Jul. 25, 2012

(65) Prior Publication Data

US 2013/0120069 A1 May 16, 2013

(30) Foreign Application Priority Data

Nov. 16, 2011 (JP) ................. P2011-250470

(51) Int. Cl.
H03F 3/68 (2006.01)

(52) U.S. Cl.
USPC ..................... 330/295; 330/124 R

(58) Field of Classification Search
USPC ............. 330/295, 124 R, 84, 286, 54
See application file for complete search history.

(56) References Cited

U.S. PATENT DOCUMENTS

| | | | |
|---|---|---|---|
| 6,232,840 B1 * | 5/2001 | Teeter et al. | 330/295 |
| 6,342,815 B1 * | 1/2002 | Kobayashi | 330/286 |
| 7,525,385 B2 * | 4/2009 | Kumar | 330/295 |
| 7,548,118 B2 * | 6/2009 | Ariie et al. | 330/295 |
| 7,953,997 B2 * | 5/2011 | Chaki | 713/323 |
| 8,022,769 B2 | 9/2011 | Ng et al. | |
| 2007/0118776 A1 | 5/2007 | Chaki | |

FOREIGN PATENT DOCUMENTS

| | | |
|---|---|---|
| JP | 10-83998 A | 3/1998 |
| JP | 2003-502896 A | 1/2003 |
| JP | 2004-336445 | 11/2004 |
| JP | 2005-216943 A | 8/2005 |
| WO | WO 2007/119266 A1 | 10/2007 |

OTHER PUBLICATIONS

Extended European Search Report Issued Feb. 14, 2013 in Patent Application No. 12178610.7.
U.S. Appl. No. 13/352,810, filed Jan. 18, 2012, Kazutaka Takagi.
Korean Office Action issued Sep. 14, 2013, in Korea Patent Application No. 10-2012-86632 (with English translation).
Japanese Office Action issued Aug. 27, 2013 in Patent Application No. 2011-250470 with English Translation.
U.S. Appl. No. 14/026,343, filed Sep. 13, 2013, Takagi.
Office Action issued Jan. 3, 2014 in European Patent Application No. 12 178 610.7.

* cited by examiner

*Primary Examiner* — Hieu Nguyen
(74) *Attorney, Agent, or Firm* — Oblon, Spivak, McClelland, Maier & Neustadt, L.L.P.

(57) ABSTRACT

According to one embodiment, a high frequency amplifier having a division circuit, FET cells, a stabilization circuit and a combination circuit is provided. The division circuit divides an input signal to produce a plurality of signals. The FET cells amplify the signals produced by the division circuit. The stabilization circuit provided with RC parallel-connected circuits which are respectively connected in series between the division circuit and gates of the FET cells. Each of the RC parallel-connected circuits has a capacitor and a resistor connected in parallel with each other. The combination circuit combines the signals amplified by the FET cells.

7 Claims, 15 Drawing Sheets

… (1)

HIGH FREQUENCY AMPLIFIER

CROSS-REFERENCE TO RELATED APPLICATION

The application is based upon and claims the benefit of priority from the prior Japanese Patent Application No. 2011-250470, filed on Nov. 16, 2011, the entire contents of which are incorporated herein by reference.

FIELD

Embodiments described herein relate generally to a high frequency amplifier.

BACKGROUND

With higher performance of field effect transistors (hereinafter referred to as "FETs") which compose FET cells (unit cells) in a high frequency amplifier, the frequency of a loop oscillation of an odd mode becomes higher and the loop becomes smaller. As a result, the loop oscillation arises between the FET cells of the high frequency amplifier.

In order to restrain such a loop oscillation occurring between FET cells, a technique of arranging a resistor (inter-cell resistor) at a suitable position between FET cells or a technique of arranging a resistor (shunt resistor) between a gate of an FET and a ground terminal has been applied.

In a case of arranging a resistor between FET cells, an oscillation which occurs in a loop including adjacent FET cells may be effectively restrained, but an oscillation which occurs in a loop including non-adjacent (dispersed) FET cells may not be restrained effectively.

In a case of arranging a resistor between a gate of an FET and a ground terminal, it is necessary to provide a large inductor in order to prevent deterioration of a high frequency characteristic such as leakage of a high frequency signal.

DETAILED DESCRIPTION

Figure 1:
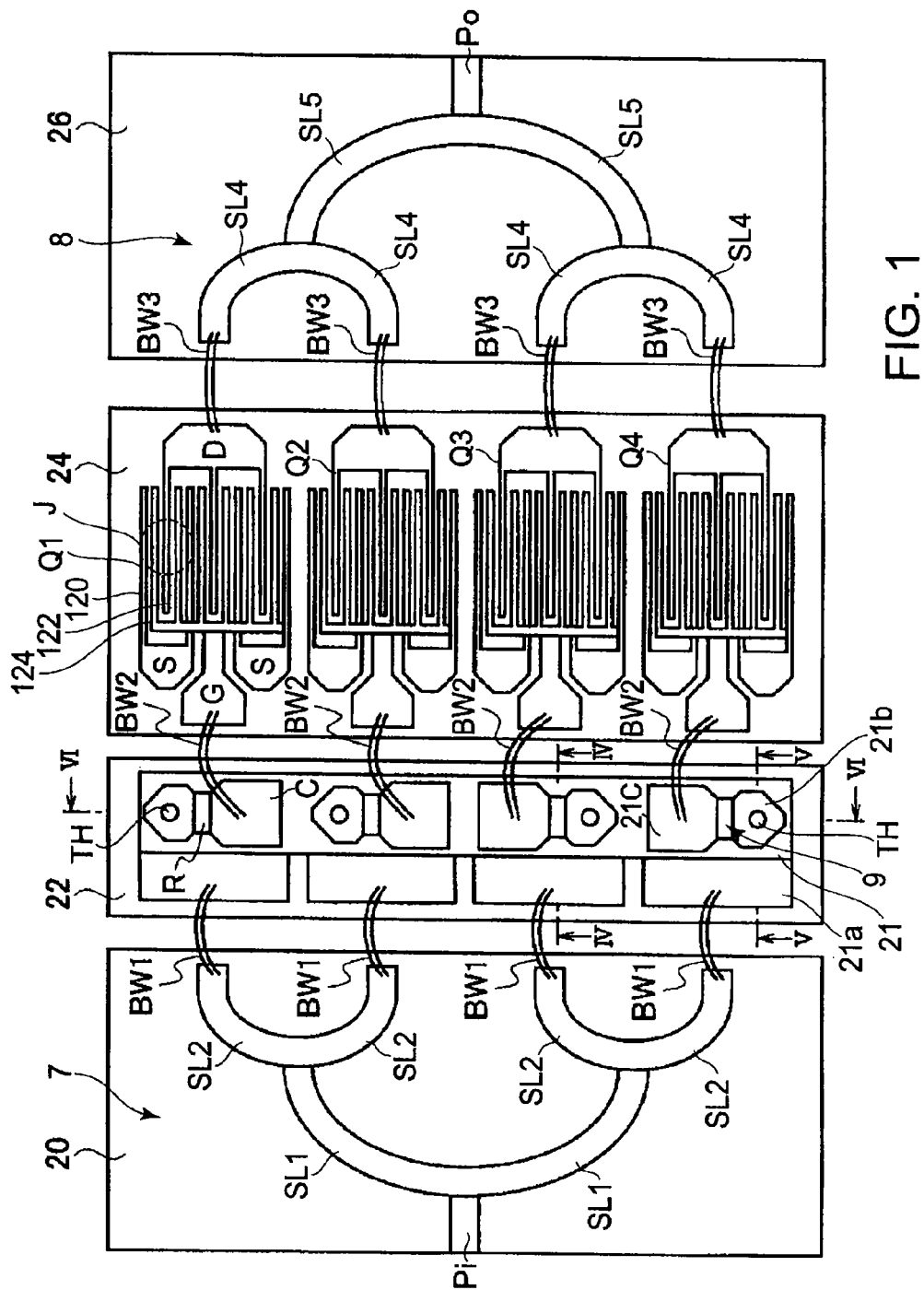
FIG. 1 is a schematic view showing a plane pattern of a high frequency amplifier according to a first embodiment.

According to one embodiment, a high frequency amplifier having a division circuit, FET cells, a stabilization circuit and a combination circuit is provided. The division circuit divides an input signal to produce a plurality of signals. The FET cells amplify the signals produced by the division circuit. The stabilization circuit provided with RC parallel-connected circuits which are connected in series between the division circuit and gates of the FET cells respectively. Each of the RC parallel-connected circuits has a capacitor and a resistor connected in parallel with each other. The combination circuit combines the signals amplified by the FET cells.

Hereinafter, further embodiments will be described with reference to the drawings.

In the drawings, the same reference numerals denote the same or similar portions respectively.

A first embodiment will be described with reference to FIGS. 1 and 2.

Figure 2:
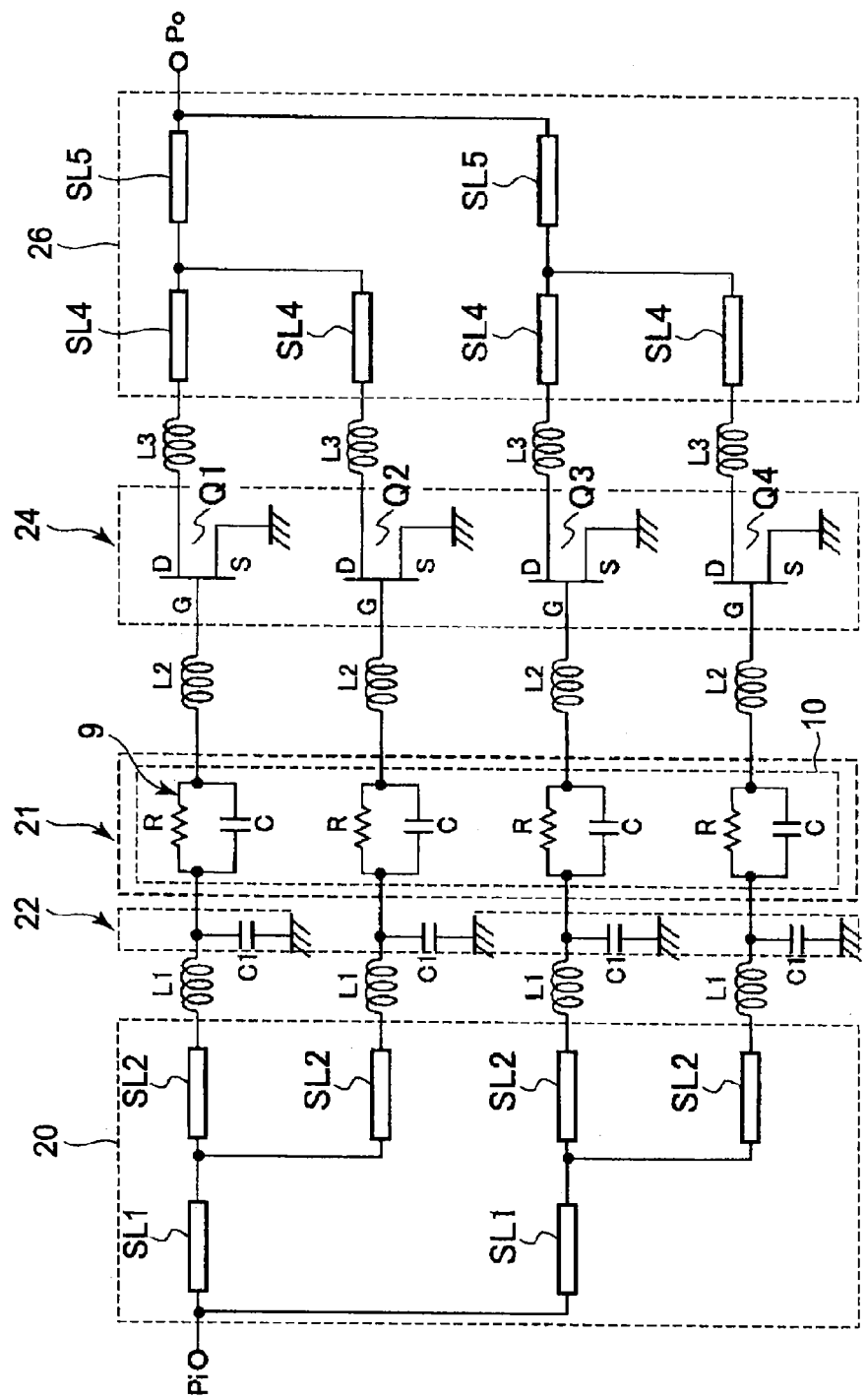
FIG. 2 is a view showing a circuit of the high frequency amplifier according to the first embodiment.

FIG. 1 is a schematic view showing a plane pattern of a high frequency amplifier according to a first embodiment. FIG. 2 is a view showing a circuit of the high frequency amplifier of FIG. 1.

The high frequency amplifier according to the first embodiment is a power amplifier. As shown in FIGS. 1 and 2, the high frequency amplifier of the first embodiment is provided with an input circuit substrate 20, a matching circuit capacitor substrate 22, a semiconductor substrate 24 and an output circuit substrate 26. A division circuit 7 for distributing an input signal is formed on the input circuit substrate 20. A stabilization circuit substrate 21 is provided above the matching circuit capacitor substrate 22. Four RC parallel-connected circuits 9 for restraining a loop oscillation occurring between FET cells (unit cells) are formed on the stabilization circuit substrate 21.

Four amplification elements (FETs) Q1-Q4 are formed on the semiconductor substrate 24. The amplification elements Q1-Q4 constitute the FET cells (unit cells) for amplifying signals divided from the division circuit 7, respectively. The amplification elements Q1-Q4 are discrete semiconductor devices. A combination circuit 8 which combines signals output from the amplification elements Q1-Q4 is formed on the output circuit substrate 26. The input circuit substrate 20, the matching circuit capacitor substrate 22, and the output circuit substrate 26 are a dielectric substrate. An input terminal Pi is formed on the input circuit substrate 20. The division circuit 7 includes two division lines SL1 and four division lines SL2. Each of the RC parallel-connected circuits 9 has a capacitor C and a resistor R connected with each other. An output terminal Po is arranged on the output circuit substrate 26. The combination circuit 8 includes four combination lines SL4 and two combination lines SL5.

The division lines SL2 and electrodes 21a provided on the matching circuit capacitor substrate 22 are connected through bonding wires BW1 (shown as L1 in FIG. 2) respectively.

Electrodes 21c provided on the stabilization circuit substrate 21 and gate electrodes G of the amplification elements Q1-Q4 are connected through bonding wires BW2 (shown as L2 in FIG. 2), respectively. Drain electrodes D of the amplification elements Q1-Q4 and the combination lines SL4 are connected through bonding wires BW3 (shown as L3 in FIG. 2), respectively. As mentioned above, the RC parallel-connected circuits 9 are not arranged on the semiconductor substrate 24, but are arranged on the matching circuit capacitor substrate 22 other than the semiconductor substrate 24.

The high frequency amplifier according to the first embodiment is provided with the four FET cells i.e. the amplification elements Q1-Q4 so as to obtain a large electric power. The input signal is divided by the division lines SL1, SL2 correspondingly to the number of the FET cells. Signals obtained through the division are amplified by the four amplification elements Q1-Q4 which constitute FET cells. Subsequently, the amplified signals are combined and outputted by the combination lines SL4 and SL5.

Specifically, an input signal of high frequency is input from the input terminal Pi, and the two division lines SL1 produce two signals from the input signal obtained from the input terminal Pi. Each set of two division lines SL2 produces two signal from one signal obtained from each division line SL1. Four signals obtained from the division lines SL2 are input to the gate electrodes G of the amplification elements Q1-Q4 respectively and are power-amplified. Each set of two combination lines SL4 which are connected to each set of two drain terminals D of the amplification elements Q1-Q4 combines each set of two signals power-amplified by the corresponding amplification elements to produce one signal. Further, the two combination lines SL5 combines two signals obtained from the four combination lines SL4 to produce one signal. The output terminal Po outputs the signal obtained from the combination lines SL5 to outside.

As mentioned above, according to the embodiment, the RC parallel-connected circuits 9 which are included in the stabilization circuit 10 are arranged correspondingly to the respective FET cells. The RC parallel-connected circuits 9 are connected in series between the division lines SL2 and the gate electrodes G, respectively. The RC parallel-connected circuits 9 restrain oscillations which occur in a loop of adjacent FET cells and in a loop of non-adjacent (dispersed) FET cells, as described below.

Figure 3:
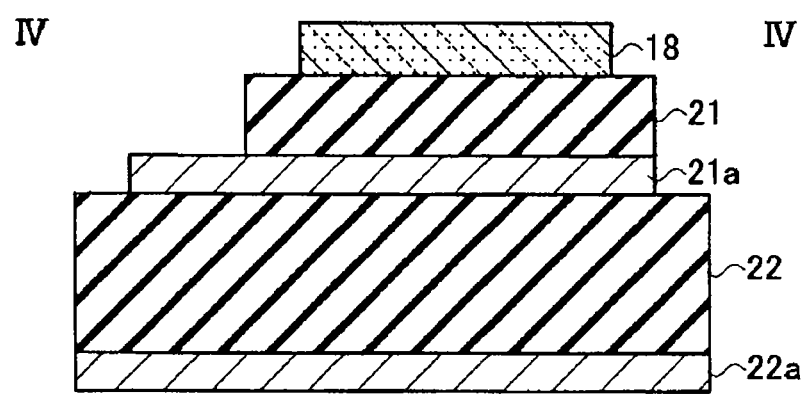
FIG. 3 is an enlarged view showing a section taken along a IV-IV line of FIG. 1 schematically.
Figure 4:
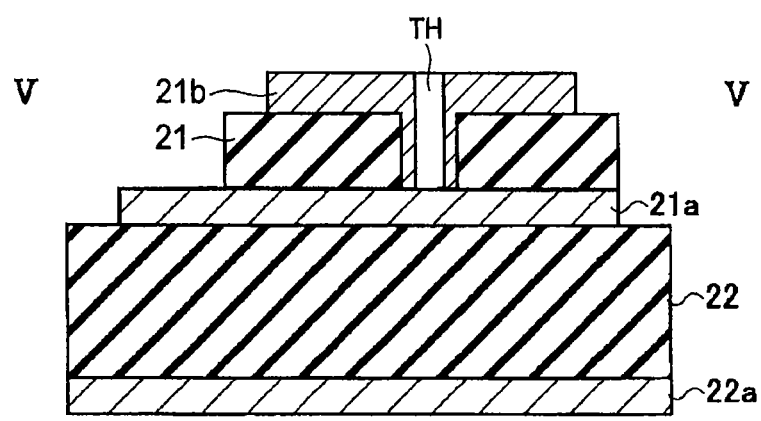
FIG. 4 is an enlarged view showing a section taken along a V-V line of FIG. 1 schematically.
Figure 5:
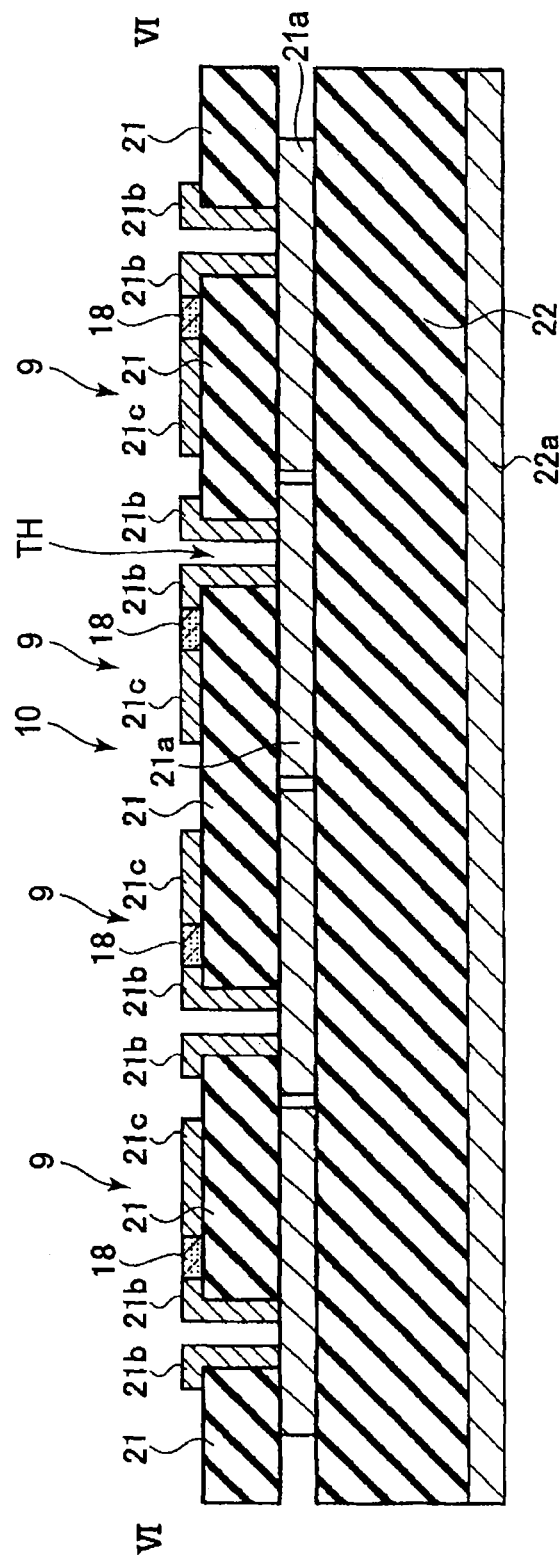
FIG. 5 is an enlarged view showing a section taken along a VI-VI line of FIG. 1 schematically.

FIGS. 3 to 5 show sectional structures of a configuration including the matching circuit capacitor substrate 22 and the stabilization circuit substrate 21 which are used in the first embodiment. FIG. 3 is an enlarged view showing a section taken along a IV-IV line of FIG. 1 schematically. FIG. 4 is an enlarged view showing a section taken along a V-V line of FIG. 1 schematically. FIG. 5 is an enlarged view showing a section taken along a VI-VI line of FIG. 1 schematically.

In FIGS. 3 to 5, an electrode 21a is formed on a surface of the matching circuit capacitor substrate (a first dielectric substrate) 22, and a ground electrode 22a is formed on the other surface of the matching circuit capacitor substrate 22 opposite to the former surface. Each capacitor C1 shown in FIG. 2 is composed of the electrode 21a, the electrode 21c and the matching circuit capacitor substrate (the first dielectric substrate) 22. The stabilization circuit substrate (a second dielectric substrate) 21 on which the RC parallel-connected circuits 9 are formed is laminated on the electrode 21a.

As shown in FIG. 5, the resistor R i.e. a resistor layer 18 which is included in each RC parallel-connected circuit 9 and the electrode 21c arranged to connect electrically with an end of the resistor layer 18 are formed adjacently on the stabilization circuit substrate 21. As shown in FIGS. 1 and 5, a plurality of through holes TH is formed in the stabilization circuit substrate 21. The other end of the resistor layer 18 and the electrode 21a are electrically connected via an electrode 21b formed in each through hole TH. The capacitor C of each RC parallel-connected circuit 9 is composed of the electrode 21a, the electrode 21c and the stabilization circuit substrate (the second dielectric substrate) 21.

For the matching circuit capacitor substrate 22, a dielectric material of a high permittivity of K=140, for example, may be employed, and, in this case, the thickness may be formed to be about 0.1 mm. For the stabilization circuit substrate 21, an alumina of K=10, for example, may be employed, and, in this case, the thickness may be formed to be about 0.1 mm.

For the resistor layer 18, a nickel chrome alloy (NiCr) which has a sheet resistance of 50Ω/□ may be employed, and, in this case, the shape may be about 50 μm in width and about 30 μm in length.

For the capacitor C, a capacitor having a capacitance value of about 0.5 to about 1.0 pF, for example, may be used. A specific example of the stabilization circuit substrate 21 for realizing such a capacitor C is shown in Table 1. In order to obtain a capacitance of 0.85 pF, in the example, alumina is employed for the material of the stabilization circuit substrate 21. In this case, the thickness is about 100 μm, and the two adjacent side lengths are about 1 mm respectively.

TABLE 1

| MATERIAL OF STABILIZATION CIRCUIT SUBSTRATE 21 | RELATIVE PERMITTIVITY | FILM THICKNESS (μm) | AREA (mm$^2$) | LENGTHS OF ADJACENT SIDES (mm) | |
|---|---|---|---|---|---|
| | | | | FIRST SIDE | SECOND SIDE |
| ALUMINA | 10 | 100 | 0.96 | 0.979796 | 0.979796 |

Figure 6:
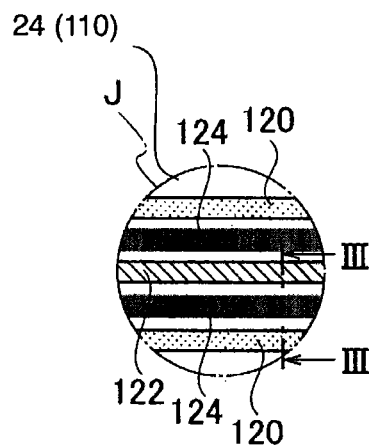
FIG. 6 is an enlarged top view showing a portion J of FIG. 1.
Figure 7:
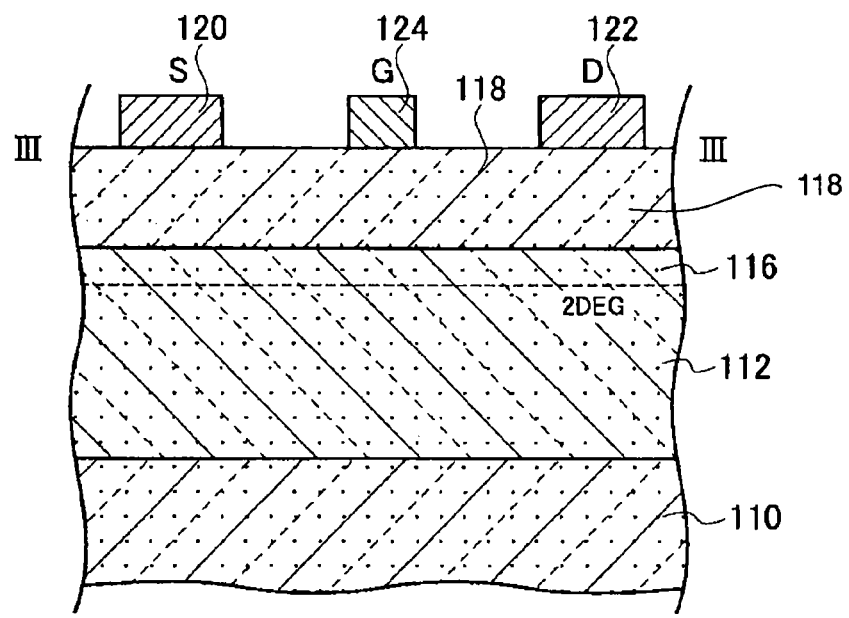
FIG. 7 is an enlarged view showing a section taken along a III-III line of FIG. 6 schematically.

FIG. 6 is an enlarged top view showing a portion J of one of the amplification elements Q1-Q4 of the high frequency amplifier according to the first embodiment shown in FIG. 1. FIG. 7 is an enlarged view showing a section taken along a III-III line of FIG. 6 schematically. FIG. 7 shows a section of a High Electron Mobility Transistor (HEMT) adopted as the amplification elements Q1-Q4.

As shown in FIGS. 1, 6, each of the amplification elements Q1-Q4 is formed on a semiconductor portion 110 which is a part of the semiconductor substrate 24 of FIG. 1. On a first surface of the semiconductor portion 110, gate finger electrodes 124, source finger electrodes 120 and drain finger electrodes 122 are formed. Each group of the gate finger electrodes 124 is bundled by each of the gate electrodes G. Each group of the source finger electrodes 120 is bundled by each of the source electrodes S. Each group of the drain finger electrodes 122 is bundled by each of the drain electrodes D.

Via-holes (not shown) are formed in portions of the semiconductor substrate 24 under the source electrodes S. Further, a ground electrode (not shown) is formed on a second surface of the semiconductor portion 110 opposite to the first surface. A barrier metal layer is formed on an inner wall of each via-hole, and a metal layer for filling each via-hole is formed on the barrier metal layer. The source electrodes S are connected to the ground electrode through the filled metal layer.

The bonding wires BW2 are connected to the gate electrodes G respectively. The bonding wires BW3 are connected to the drain electrodes D respectively.

The semiconductor substrate 24 or the semiconductor portion 110 may be any one of a GaAs substrate, a SiC substrate, a GaN substrate, a substrate including a SiC substrate on which a GaN epitaxial layer is formed, a substrate including a SiC substrate on which a hetero-junction epitaxial layer of GaN/AlGaN is formed, a sapphire substrate, or a diamond substrate.

As shown in FIG. 7, a compound-semiconductor layer 112 of a nitride series is formed on the semiconductor portion 110, and an aluminum gallium nitride layer ($Al_xGa_{1-x}N$) 118 is formed on the semiconductor layer 112. X is a value which satisfies $0.1 \leq x \leq 1$. Each source finger electrode 120, each gate finger electrode 124 and each drain finger electrode 122 are formed on the semiconductor layer 118. A Two-Dimensional Electron Gas layer (2DEG layer) 116 is formed at an interface between the semiconductor layers 112, 118.

Figure 8:
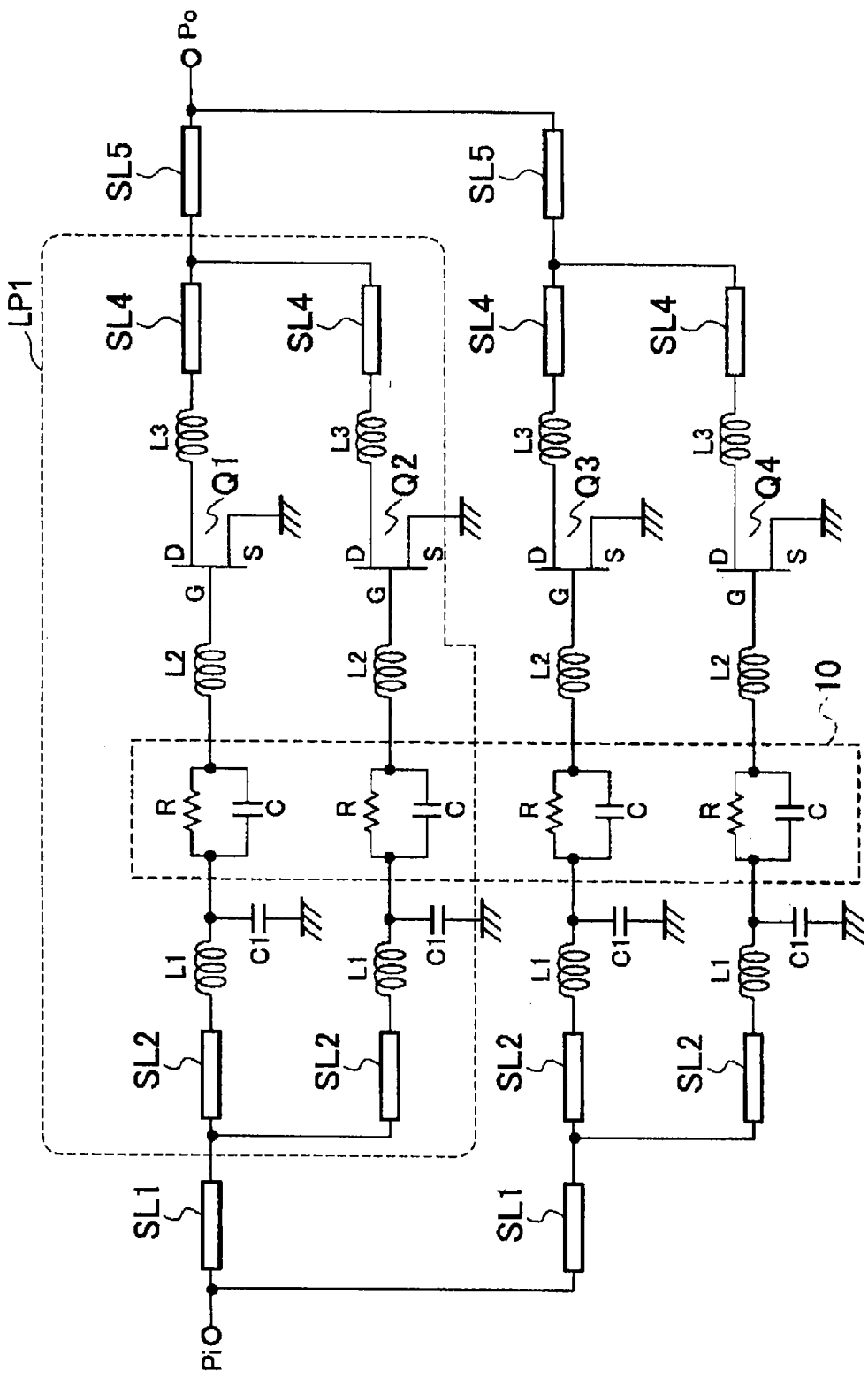
FIG. 8 is a view showing a loop between adjacent FET cells.
Figure 9:
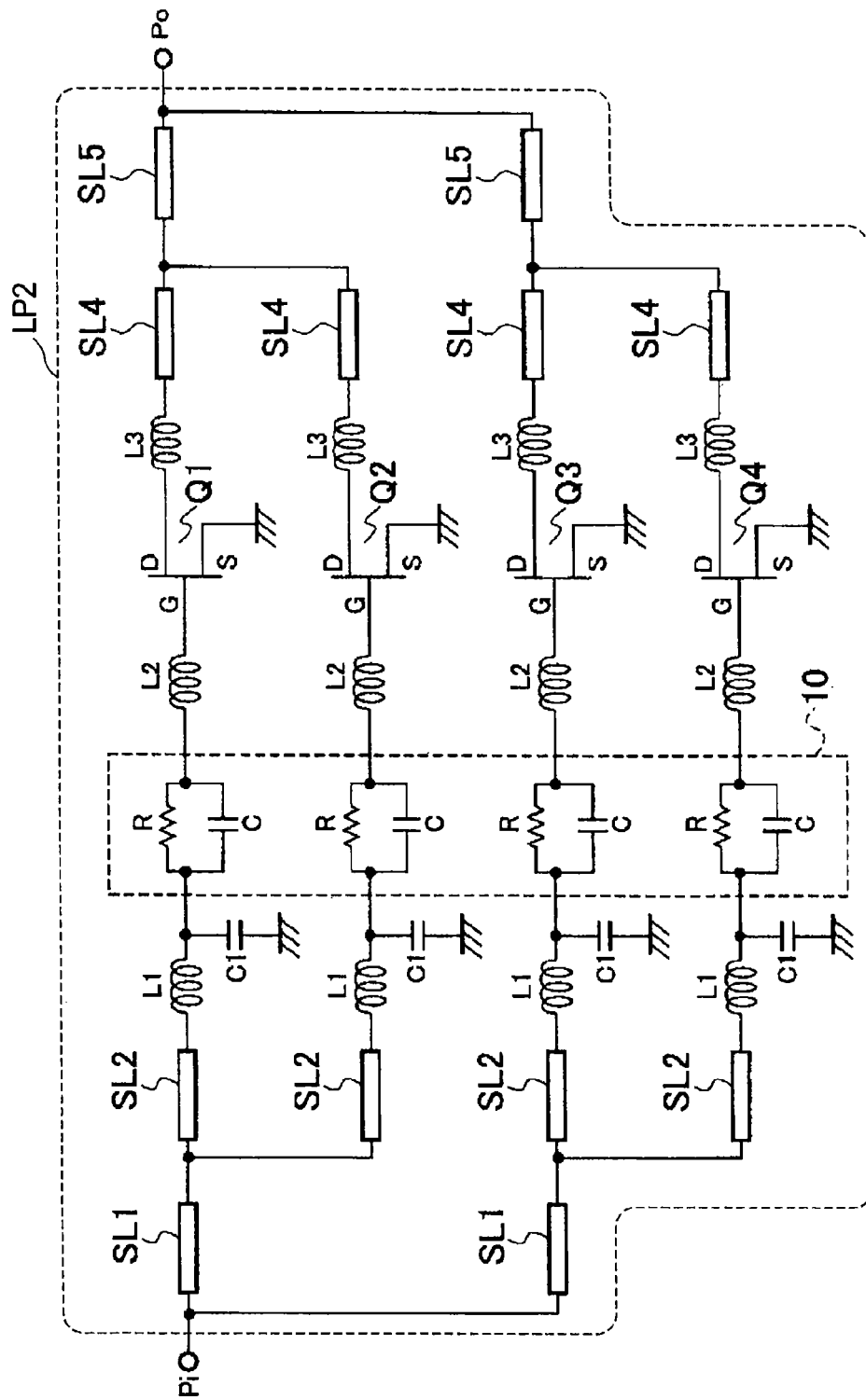
FIG. 9 is a view showing a loop between non-adjacent FET cells.

FIG. 8 illustrates a view showing a loop LP1 between adjacent FET cells which is formed in the first embodiment. FIG. 9 illustrates a view showing a loop LP2 between non-adjacent (dispersed) FET cells which is formed in the first embodiment. In the high frequency amplifier according to the first embodiment, as shown in FIG. 1, the RC parallel-connected circuits 9 which is included in the stabilization circuit 10 are arranged between the division lines SL2 and the gate electrodes G of the amplification elements Q1-Q4 respectively so that the circuits 9 may correspond to the respective amplification elements Q1-Q4.

In this case, any one of the waves of the loops passes through any one of the RC parallel-connected circuits 9. Thus, according to the high frequency amplifier of the first embodiment, an oscillation which occurs in the loop LP2 of the non-adjacent (dispersed) FET cells shown in FIG. 9 can be restrained as well as an oscillation which occurs in the loop LP1 of the adjacent FET cells shown in FIG. 8. According to the high frequency amplifier of the first embodiment, since the RC parallel-connected circuits 9 which are included in the stabilization circuit 10 are arranged not between the FET cells but are arranged correspondingly to the respective FET cells, a loop oscillation which is caused by any combination of the FET cells can be restrained effectively.

Figure 10:
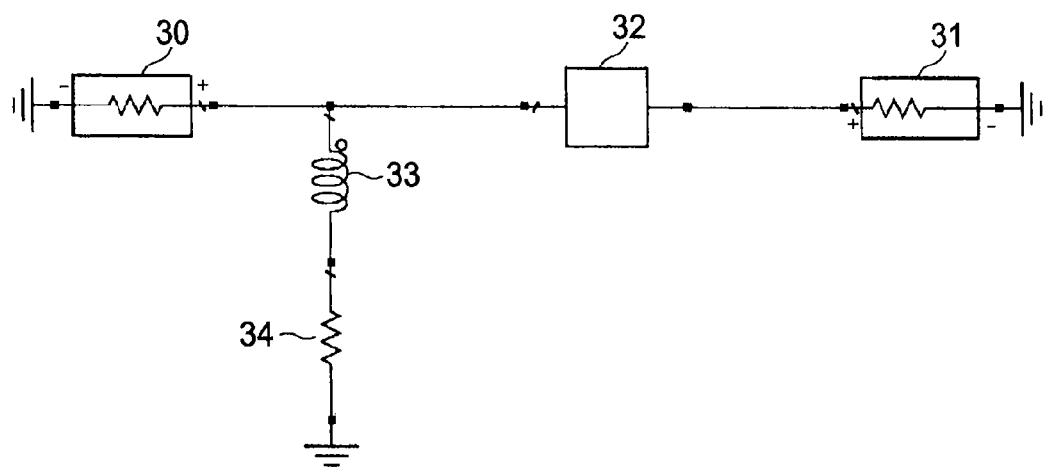
FIG. 10 is a schematic circuit diagram of a high frequency amplifier having a stabilization circuit according to a comparative example.

FIG. 10 shows an example of a fundamental circuit configuration including a stabilization circuit of a high frequency amplifier according to a comparative example. The example is provided with input and output terminations 30, 31, an FET cell 32, an inductor 33 and a resistor 34. A gate of the FET cell 32 is connected to a series circuit including the inductor 33 and the resistor 34, and the gate is grounded via the series circuit. For example, the terminations 30, 31 have an impedance of 50Ω respectively, the inductor 33 has an inductance of 0.156 nH, and the resistor 34 has a resistance of 12.375Ω.

Figure 11:
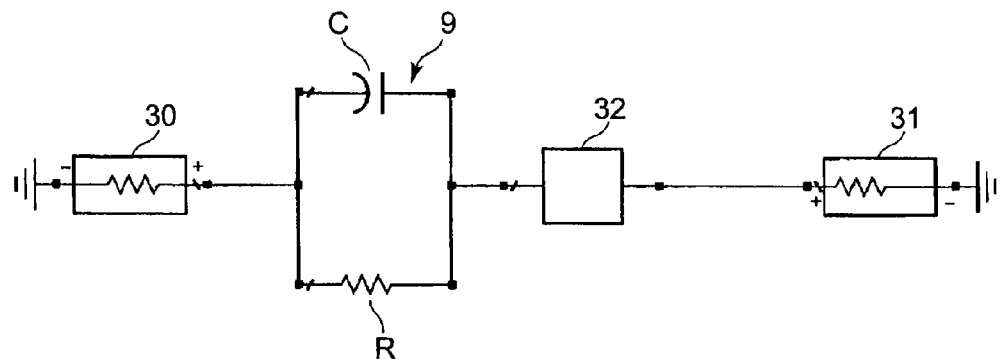
FIG. 11 is a schematic circuit diagram of a high frequency amplifier having a stabilization circuit according to the first embodiment.

FIG. 11 shows an example of a fundamental circuit configuration including a stabilization circuit corresponding to the stabilization circuit of the high frequency amplifier according to the first embodiment. In the example, series resistors are used. Specifically, the example is provided with input and output terminations 30, 31, a FET cell 32, a RC parallel-connected circuit 9 including a resistor 34 and a capacitor C. One ends of the input terminations 30, 31 are grounded respectively. The other end of the output termination 31 is connected to a drain of the FET cell 32. The RC parallel-connected circuit 9 is connected between a gate of the FET cell 32 and the other end of the input termination 30. For example, the terminations 30, 31 have an impedance of 50Ω respectively, the capacitor C has a capacitance of 0.85 pF, and the resistor R has a resistance of 30Ω.

The stabilization circuits shown in FIGS. 10, 11 can stabilize the high frequency amplifiers, which operate at 15 GHz, for example. Further, even when the high frequency amplifiers operate at 7 GHz or more, the stability factor can exceed one (1). This is because the frequency at which a loop oscillation is easy to occur is integral or ½ multiple of an operation frequency and thus a loop oscillation does not occur so far as the stability factor exceeds one (1) at a frequency higher than one half of the operation frequency.

In the stabilization circuit of the comparative example shown in FIG. 10, the resistor R is provided between the gate of the FET cell 32 and a ground terminal. In order to prevent deterioration of a high frequency characteristic i.e. leakage of a high frequency signal, it is necessary to arrange the inductor 33, which has a large inductance, in the circuit configuration of FIG. 10. On the other hand, in the circuit configuration including the stabilization circuit corresponding to the stabilization circuit of the first embodiment, which is formed to have series resistors, the RC parallel-connected circuit 9 including the capacitor C and the resistor R is provided, as shown in FIG. 11. Accordingly, the stabilization circuit of the first embodiment does not always need to arrange such an inductor as the inductor 33 of the stabilization circuit of the comparative example.

Since the stabilization circuit of the comparative example needs grounding, it is necessary to provide a via-hole for forming an electrode in the via-hole, in a semiconductor substrate. The electrode is formed to connect the stabilization circuit with a ground electrode. But, since the stabilization circuit of the first embodiment does not always need grounding, the layout is easier.

Figure 12:
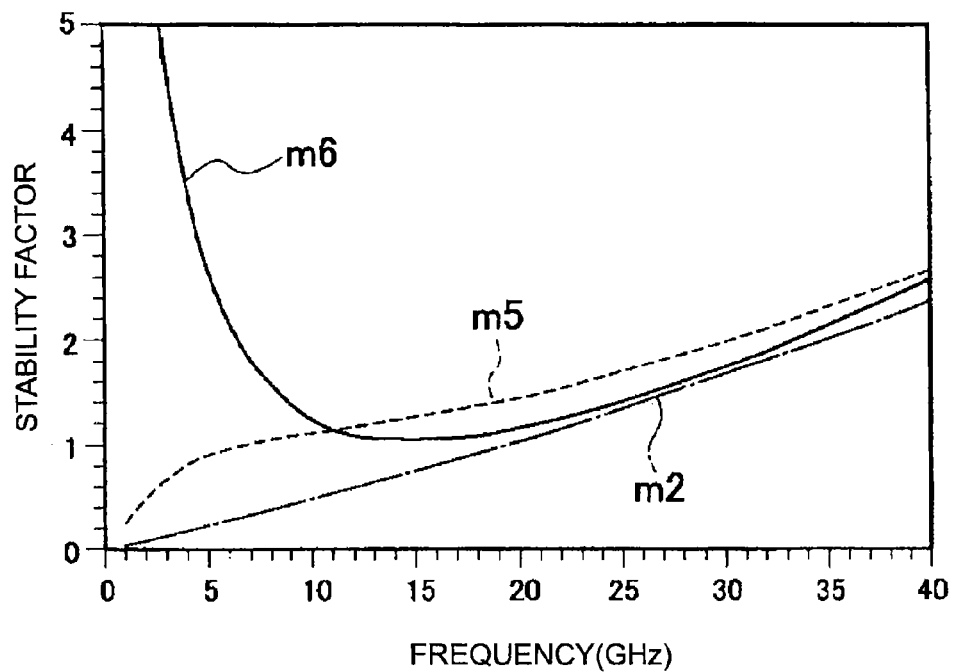
FIG. 12 is a view for comparing stability factors of the stabilization circuits according to the comparative example and the first embodiment.

FIG. 12 is a view for comparing stability factors of the stabilization circuit of the comparative example and the stabilization circuit of the first embodiment. In FIG. 12, a line m6 indicates a stability factor of a case where the stabilization circuit of the comparative example is used, a line m5 indicates a stability factor of a case where the stabilization circuit of the first embodiment is used, and a line m2 indicates a stability factor of a case where any stabilization circuit is not used. For example, stability factors at 7 GHz will be focused below. The stability factor of the case using the stabilization circuit of the comparative example is 1.840, and the stability factor of the case using the stabilization circuit of the first embodiment is 1.041. On the other hand, the stability factor of the case where any stabilization circuit is not used reaches one (1) at a frequency which exceeds 20 GHz nearly. Accordingly, as apparent from FIG. 12, the stability factors of both of the cases which use the stabilization circuit of the comparative example and the stabilization circuit of the first embodiment exceed one (1) at a frequency higher than one half of the operation frequency (15 GHz) i.e. a frequency of about 7 GHz or more. When an operation frequency is expressed as "f" and a stability factor is expressed as "k", the stability factor k can be one (1) or more at a frequency ½f.

Figure 13:
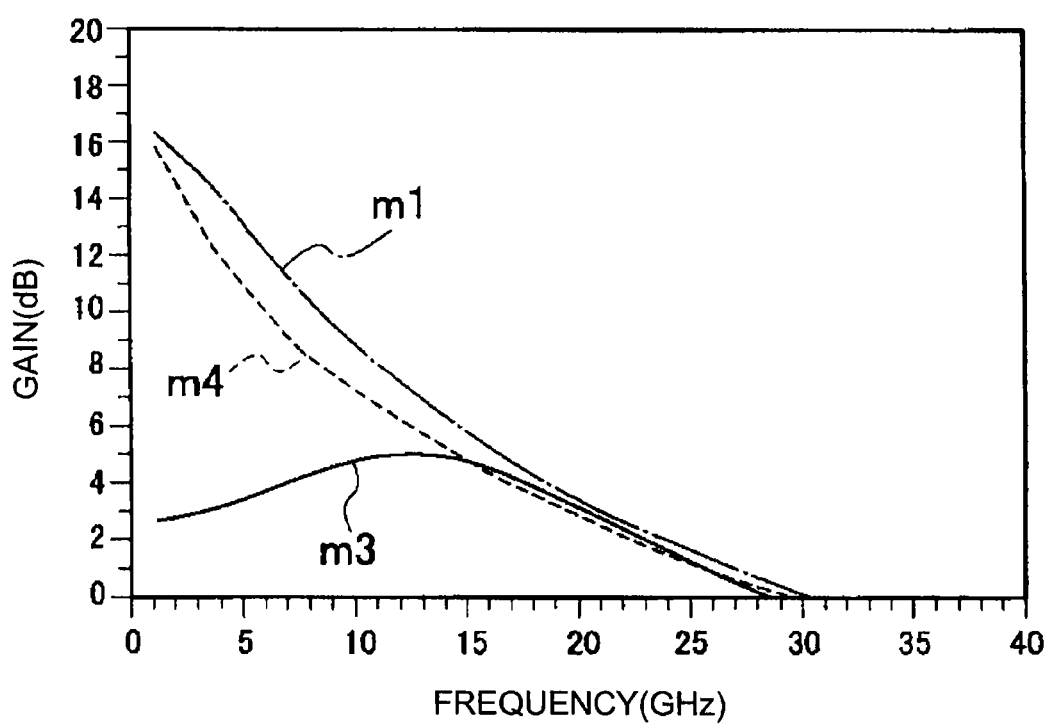
FIG. 13 is a view for comparing gains of the stabilization circuits according to the comparative example and the first embodiment.

FIG. 13 is a view for comparing gains of the stabilization circuit of the comparative example and the stabilization circuit of the first embodiment. In FIG. 13, a line m3 indicates a gain of a case where the stabilization circuit of the comparative example is used, a line m4 indicates a gain of a case where the stabilization circuit of the first embodiment is used, and a line m1 indicates a gain of a case where any stabilization circuit is not used. For example, gains at 7 GHz will be focused below. The gain of the case using the stabilization circuit of the comparative example is 4.759 dB, and the gain of the case using the stabilization circuit of the first embodiment is 4.729 dB. Accordingly, as apparent from FIG. 13, at an operation frequency of 15 GHz, the gains of both of the cases that use the stabilization circuits of the comparative example and the first embodiment are lower only by approximately 1 dB than the gain (5.729 dB) of the case where any stabilization circuit is not used.

As explained above, according to the high frequency amplifier of the first embodiment, the RC parallel-connected circuits 9 which are included in the stabilization circuit 10 are arranged correspondingly to the respective FET cells. Thus, an oscillation which occurs in a loop of non-adjacent (dispersed) FET cells can be restrained as well as an oscillation which occurs in a loop of adjacent FET cells. According to the high frequency amplifier of the first embodiment, since the RC parallel-connected circuits 9 which are included in the stabilization circuit 10 are arranged not between the FET cells but are arranged correspondingly to the respective FET cell, a loop oscillation which is caused by any combination of the FET cells can be restrained effectively.

The RC parallel-connected circuits 9 provided in the high frequency amplifier according to the first embodiment are connected in series between the division lines SL2 and the gate electrodes G of the amplification elements Q1-Q4. Further, the stabilization circuit substrate 21 is provided with the RC parallel-connected circuits 9 having the capacitor C and the resistor R respectively. Thus, the high frequency amplifier according to the first embodiment can be smaller than a high frequency amplifier having a stabilization circuit which includes a shunt resistor, and can secure almost the same stability factor and the same gain as a high frequency amplifier which includes a shunt resistor.

Further, in a case of a discrete type high frequency amplifier, when a shunt coil is used in order to constitute a stabilization circuit by a shunt resistor as in the comparative example, the high frequency amplifier becomes easy to be affected by an electrical influence which is caused by electromagnetic induction combination with a series coil of a matching circuit. However, according to the high frequency amplifier of the first embodiment, since the stabilization circuit substrate 21 includes the RC parallel-connected circuits 9 having the capacitor C and resistor R respectively, such electromagnetic induction combination is difficult to occur.

Figure 14:
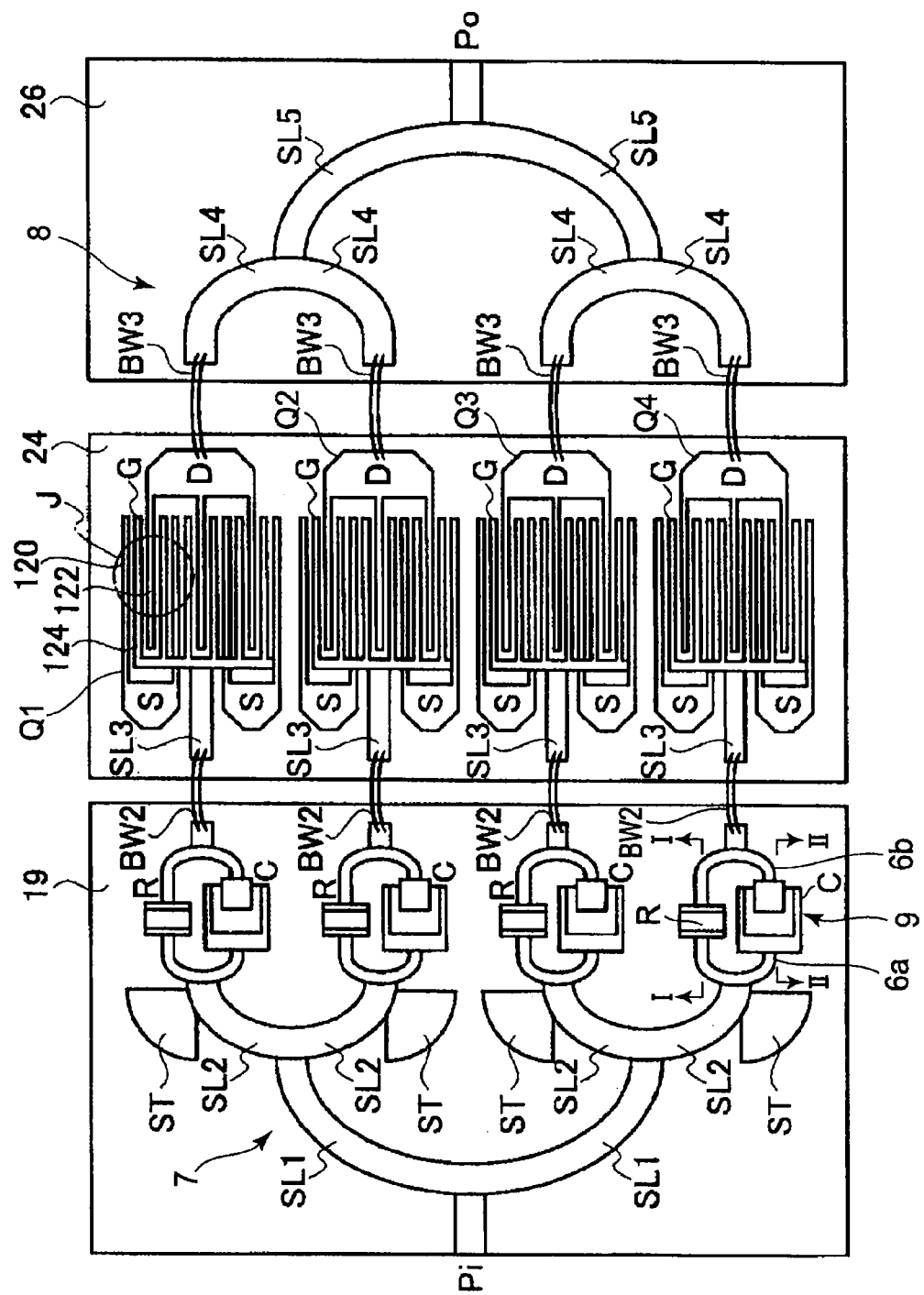
FIG. 14 is a schematic view showing a plane pattern of a high frequency amplifier according to a second embodiment.
Figure 15:
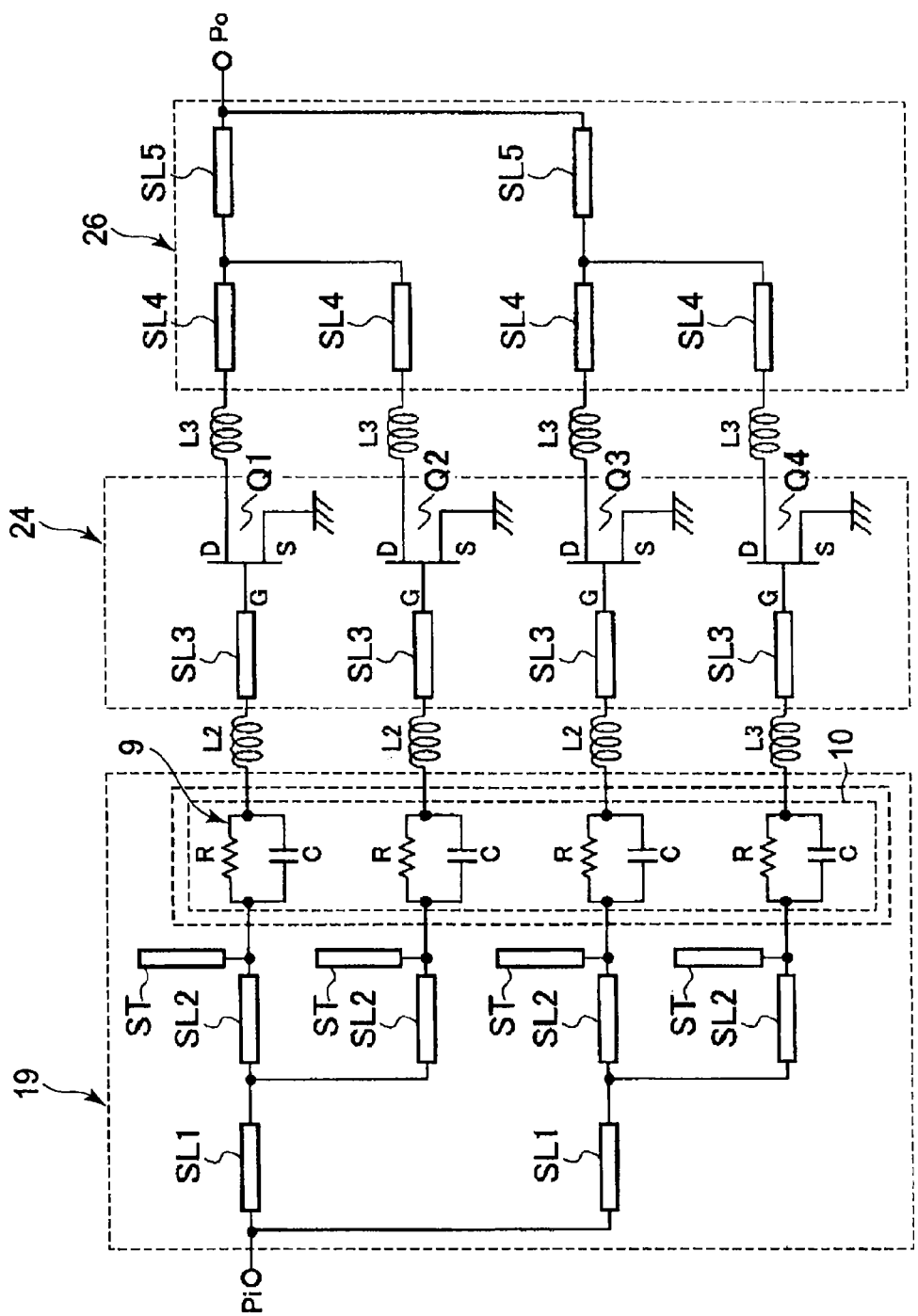
FIG. 15 is a view showing a circuit of the high frequency amplifier according to the second embodiment.

FIG. 14 is a schematic view showing a plane pattern of a high frequency amplifier according to a second embodiment. FIG. 15 shows a circuit configuration of the high frequency amplifier of FIG. 14.

As shown in FIG. 14, the high frequency power amplifier according to the second embodiment is provided with an input circuit substrate 19, a semiconductor substrate 24 and an output circuit substrate 26. A division circuit 7 and four RC parallel-connected circuits 9 are formed on the input circuit substrate 19. The division circuit 7 is provided with two division lines SL1 and four division lines SL2 which divides an input signal. The RC parallel-connected circuits 9 are included in a stabilization circuit 10 to restrain a loop oscillation which is caused between four FET cells as described below. An input terminal Pi, conductive lines 6a, 6b, and stub circuits ST are arranged on the input circuit substrate 19. Each of the RC parallel-connected circuits 9 is provided with a capacitor C and a resistor R which are connected in parallel with each other.

Four amplification elements Q1-Q4 which constitute the FET cells respectively are formed on the semiconductor substrate 24. The amplification elements Q1-Q4 amplify signals obtained by the division which is performed by the division circuit 7. Division lines SL3 are arranged on the semiconductor substrate 24. A combination circuit 8 is formed on the output circuit substrate 26. The combination circuit 8 is provided with four combination lines SL4 and two combination lines SL5, which combines outputs from the amplification elements Q1-Q4. An output terminal Po is arranged on the output circuit substrate 26. The input circuit substrate 19 and the output circuit substrate 26 are dielectric substrates.

The division lines SL2 are connected with the conductive lines 6a respectively. The conductive lines 6b are connected with the division lines SL3 through bonding wires BW2 (shown as wires L2 in FIG. 15) respectively. The division lines SL3 are connected to gate electrodes G of the amplification elements Q1-Q4 respectively. Drain electrodes D of the amplification elements Q1-Q4 and the combination lines SL4 included in the division circuit 8 are connected through bonding wires BW3 (shown as wires L3 in FIG. 15) respectively. In the high frequency power amplifier according to the second embodiment, the stabilization circuit 10 which is provided with the RC parallel-connected circuits 9 having the capacitor C and the resistor R respectively is not arranged on the semiconductor substrate 24, but is arranged together with the division circuit 7 on the input circuit substrate 19 other than the semiconductor substrate 24.

The high frequency amplifier according to the second embodiment is provided with the four FET cells i.e. the amplification elements Q1-Q4, so as to obtain a large electric power. The input signal is divided by the division lines SL1 and SL2, correspondingly to the number of the FET cells. Signals obtained by the division are amplified by the amplification elements Q1-Q4. The amplified signals are combined and outputted by the combination lines SL4 and SL5.

Specifically, an input signal of a high frequency is input from the input terminal Pi, and the two division lines SL1 produce two signals from the input signal obtained from the input terminal Pi. Each set of two division lines SL2 produces two signals from one signal obtained from each division lines SL1. Four signals obtained from the four division lines SL2 are input to the gate electrodes G of the amplification elements Q1-Q4 respectively through the division lines SL3 and are power-amplified. Each set of two combination lines SL4 which is connected to each set of two drain terminals D of the amplification elements Q1-Q4 combines each set of two signals which are power-amplified by each set of two amplification elements to produces one signal. Further, the two combination lines SL5 combine two signals obtained from the combination lines SL4 to one signal. The output terminal Po outputs the signal obtained from the combination lines SL5 to outside. As shown in FIG. 15, the stub circuits ST are connected respectively to transmission lines of the signals which are obtained from the division lines SL2 or to portions of the division lines SL2.

The RC parallel-connected circuits 9 which are included in the stabilization circuit 10 are arranged between the division lines SL2 and the corresponding gate electrodes G of the amplification elements Q1-Q4, respectively. The RC parallel-connected circuits 9 have a resistor R and a capacitor C connected in parallel with each other, respectively. The resistor R and the capacitor C are mutually connected by the conductive lines 6a, 6b. The RC parallel-connected circuits 9 restrain an oscillation which occurs in a loop of adjacent FET cells composed of the amplification elements Q1-Q4 and an oscillation which occurs in a loop of non-adjacent (dispersed) FET cells.

According to the high frequency amplifier of the second embodiment, since the stabilization circuit 10 is arranged not between the FET cells but is arranged correspondingly to all of the FET cells respectively, a loop oscillation which is caused by any combination of the FET cells can be restrained effectively.

The stabilization circuit 10 provided in the high frequency amplifier according to the second embodiment is connected in series between the division line SL2 and the gate electrodes G of the amplification elements Q1-Q4. The stabilization circuit 10 is provided with the RC parallel-connected circuits 9 having the capacitor C and the resistor R respectively.

Accordingly, the high frequency amplifier according to the second embodiment can be smaller than a high frequency amplifier using a stabilization circuit including a shunt resistor, and can secure almost the same stability factor and the same gain as the latter high frequency amplifier.

Figure 16:
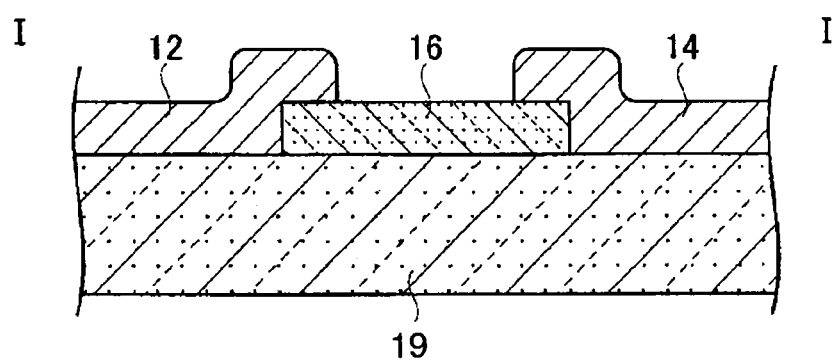
FIG. 16 is an enlarged view showing a section taken along a I-I line of FIG. 14 schematically.

FIG. 16 shows a configuration example of the resistor R included each RC parallel-connected circuit 9 in the second embodiment. FIG. 16 is an enlarged view showing a section taken along a I-I line of FIG. 14 schematically.

The resistor R is composed of a resistor layer 16 arranged on a portion of the semiconductor substrate 19 between respective ends of electrodes 12, 14. The electrodes 12, 14 constitute the conductive lines 6a, 6b which are provided on the semiconductor substrate 19, respectively. Tip end portions of the electrodes 12, 14 are connected with the resistor layer 16 so as to extend over end portions of the resistor layer 16, respectively. The other end of the electrode 12 is connected with one of the division lines SL2, and the other end of the electrode 14 is connected with one of the division lines SL3.

For example, a resistor of about 30Ω may be used as the resistor R. A specified example of the resistor layer 16 for realizing such a resistor of about 30Ω is shown in Table 2. When the material of the resistor is GaAs containing Si and the dose amount of Si is $4\times10^{13}/cm^2$, a line width of about 50 μm and a line length of about 20 μm may be adopted for the resistor layer. Further, when the material of the resistor is AlGaN/GaN where the Al composition rate of AlGaN is 25% and the thickness of AlGaN is 25 nm, a line width of about 50 μm and a line length of about 4 μm may be adopted for the resistor layer.

Figure 17:
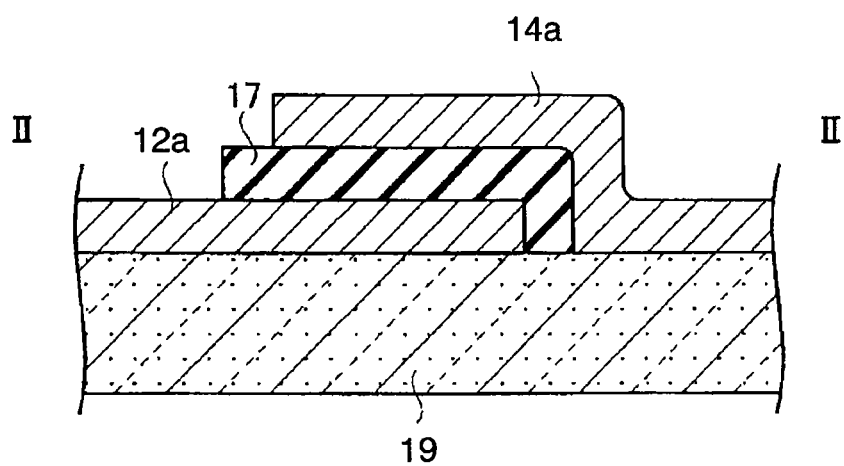
FIG. 17 is an enlarged view showing a section taken along a II-II line of FIG. 14 schematically.

FIG. 17 shows a configuration example of the capacitor C included in each RC parallel-connected circuit 9 in the second embodiment. FIG. 17 is an enlarged view showing a section taken along a II-II line of FIG. 14 schematically. The capacitor C has a MIM structure where the capacitor C is formed to have a structure which interposes an insulating layer 17 between the electrodes 12, 14 composing the conductive lines 6a, 6b. Specifically, the capacitor C is formed of the electrodes 12a, 14a and the insulating layer 17. The electrodes 12a, 14a constitute the conductive lines 6a, 6b respectively and are arranged on the semiconductor substrate 19. The insulating layer 17 are arranged on a portion of the semiconductor substrate 19 between respective ends of electrodes 12a, 14a. The electrodes 12a is formed so as to extend over the insulating layer 17. The insulating layer 17 is formed so as to extend over the electrodes 14a. Accordingly, the capacitor C has a structure where the insulating layer 17 is sandwiched between the electrodes 12a, 14a. The other end of the electrode 12a is connected with one of the division lines SL2, and the other end of the electrode 14a is connected with one of the division lines SL3.

For the capacitor C, a capacitor C of about 0.5 to 1.0 pF may be used, for example. A specified example of the insulating layer is shown in Table 3. When the material of the insulating layer 17 is SiN having a thickness of 0.2 μm, two adjacent side lengths may be about 50 μm and about 50 μm. When the material of the insulating layer is $SiO_2$ having a thickness of about 0.1 μm, two adjacent side lengths may be about 50 μm and about 50 μm.

TABLE 3

| MATERIAL OF DIELECTRIC LAYER 17 | RELATIVE PERMITTIVITY | FILM THICKNESS (μm) | AREA (mm²) | LENGTHS OF ADJACENT SIDES (mm) | |
|---|---|---|---|---|---|
| | | | | FIRST SIDE | SECOND SIDE |
| SiN | 7 | 0.2 | 0.0027 | 0.0027 | 50 |
| SiO₂ | 3.9 | 0.1 | 0.0024 | 0.04899 | 50 |

While high-frequency amplifiers according to certain embodiments have been described above, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the amplification elements to be mounted on a high frequency amplifier are not limited to FETs or HEMTs. Laterally Diffused Metal-Oxide-Semiconductor (LDMOS)

TABLE 2

| | SIZE OF RESISTOR LAYER 16 | | |
|---|---|---|---|
| MATERIAL OF RESISTOR LAYER 16 | SHEET RESITANCE (Ω/□) | LINE WIDTH (μm) | LINE LENGTH (μm) |
| GaAs (DOSE AMOUNT OF Si: $4 \times 10^{13}/cm^2$) | 80 | 50 | 18.75 |
| AlGaN/GaN (Al COMPOSITION RATE: 25%, THICKNESS: 25 nm ) | 400 | 50 | 3.75 | field effect transistors or hetero-junction bipolar transistors (HBTs) may be also used as the amplification elements.

What is claimed is:

1. A high frequency amplifier, comprising:
   a division circuit which divides an input signal to produce a plurality of signals;
   FET cells which amplifies signals produced by the division circuit;
   a stabilization circuit provided with RC parallel-connected circuits which are respectively connected in series between the division circuit and gates of the FET cells, each of the RC parallel-connected circuits having a capacitor and a resistor connected in parallel with each other; and
   a combination circuit which combines signals amplified by the FET cells, wherein the stabilization circuit is arranged on a substrate other than a semiconductor substrate on which the FET cells are arranged.

2. A high frequency amplifier according to claim 1, wherein each of the FET cells and each of the RC parallel-connected circuits are connected with each other through a wire, respectively.

3. A high frequency amplifier according to claim 1, wherein the division circuit, the stabilization circuit and the combination circuit are respectively arranged on substrates other than a semiconductor substrate on which the FET cells are arranged.

4. A high frequency amplifier according to claim 3, wherein the division circuit and the stabilization circuit are arranged on the same substrate other than a semiconductor substrate on which the FET cells are arranged.

5. A high frequency amplifier according to claim 3, wherein the stabilization circuit includes:
   a circuit substrate of a dielectric material;
   a first electrode formed on the circuit substrate;
   a dielectric layer formed on the first electrode, the resistor being formed on the dielectric layer;
   a second electrode formed on the dielectric layer to compose the capacitor with the first electrode and the dielectric layer; and
   a third electrode formed in a through hole which is provided in the dielectric layer and connects the first electrode with the resistor electrically.

6. A high frequency amplifier according to claim 4, wherein the stabilization circuit includes:
   a circuit substrate of a dielectric material;
   a resistor formed on the circuit substrate;
   a capacitor formed on the circuit substrate, the capacitor having a first electrode, a dielectric layer formed on the first electrode, and a second electrode formed on the dielectric layer;
   a first conductive line which connects an end of the resistor and the first electrode electrically; and
   a second conductive line which connects the other end of the resistor and the second electrode electrically.

7. A high frequency amplifier according to claim 1, wherein the substrate other than the semiconductor substrate is a dielectric substrate.

* * * * *